United States Patent [19]

Flamholz

[11] Patent Number: 4,637,714

[45] Date of Patent: Jan. 20, 1987

[54] INSPECTION SYSTEM FOR PELLICALIZED RETICLES

[75] Inventor: Alexander L. Flamholz, Monsey, N.Y.

[73] Assignee: International Business Machines Corporation, Armonk, N.Y.

[21] Appl. No.: 793,599

[22] Filed: Oct. 31, 1985

[51] Int. Cl.⁴ .............................................. G03B 27/32
[52] U.S. Cl. ......................................... 355/77; 355/53
[58] Field of Search ........................ 355/30, 53, 77, 43, 355/45

[56] References Cited

U.S. PATENT DOCUMENTS

| | | | |
|---|---|---|---|
| 3,819,265 | 6/1974 | Feldman et al. | 355/77 X |
| 4,131,363 | 12/1978 | Shea et al. | 355/53 X |
| 4,239,384 | 12/1980 | Treiber | 355/77 X |
| 4,335,956 | 6/1982 | Findeis et al. | 355/77 X |
| 4,416,539 | 11/1983 | Tereshita | 355/77 |
| 4,443,096 | 4/1984 | Johannsmeier et al. | 355/53 |
| 4,577,961 | 3/1986 | Tereshita | 355/77 |

Primary Examiner—Richard A. Wintercorn
Attorney, Agent, or Firm—Sughrue, Mion, Zinn, Macpeak & Seas

[57] ABSTRACT

A method of detecting defects in a reticle used to fabricate semiconductor circuits by enhancing the image of a defect in one chip site without appreciably changing all other chip site images. In a step-and-repeat alignment system, a first chip site is exposed under normal intensities to print the reticle pattern at a proper exposure level. At a second chip site, exposure takes place using the same reticle (or a second identical reticle) at lower intensity levels. Given this underexposure, residual photoresist will remain at defect sites. The optical imagery at the two chip sites is different allowing comparator techniques to be used.

14 Claims, 5 Drawing Figures

EXPOSURE PATTERNS
FOR DEFECT
DETECTION

INSPECTION SYSTEM FOR PELLICALIZED RETICLES

BACKGROUND OF THE INVENTION

This invention relates to a method of defect detection in step-and-repeat alignment and exposure systems. Such systems are used for projection printing of a pattern from a reticle onto a semiconductor wafer.

In particular, step-and-repeat alignment and exposure systems print a circuit pattern appearing on a reticle onto a semiconductor wafer having a photosensitive coating. This is done by repeatedly projecting an image of the reticle onto the wafer using actinic light. Such projection systems are used for device fabrication having reductions of greater than 1, typically 10:0 and 5:1 wherein the reticle contains a single copy or multiple copies (full field printing) of the device pattern to be employed. While the reticles are designed, built and maintained to be defect free throughout their use, contamination is a significant problem.

Defect-free use is especially significant in step-and-repeat systems because any defect on the reticle will be printed at every chip site as the pattern is stepped over the wafer. Thus, a defect in the reticle will repeat at each chip site which not only reduces yield but can potentially render all chip sites unacceptable.

Various techniques have disclosed in the literature to minimize such defects. Reference is made to Levy, "Automated Equipment for 100% Inspection of Photomasks", *Solid State Technology*, Vol. 21, pp. 60–71, May 1978 and Singer, "Photomask and Reticle Defect Detection", *Semiconductor International*, April 1985, pp. 66–73 for a generalized discussion on the problem and potential known solutions in the technology.

Reference is made to U.S. Pat. No. 4,443,096 which is related to a precision step-and-repeat alignment and exposure system for printing circuit patterns on a wafer. A pair of apertured optical detectors are aligned with identical portions of the projected image of the reticle and scanned across the image of the reticle. Any difference in the electrical image of the two optical detectors indicates the presence of dirt or a flaw in the reticle.

The optical comparator technique as used in the '096 patent therefore detects defects in the reticle by electro-optically comparing the imagery of two adjacent chip sites on a chip array. However, in the case of a step-and-repeat alignment and exposure technique to print a circuit pattern, the printing on the reticle onto a semiconductor wafer having a photosensitive coating, given the repeated projection of the image on the reticle, any reticle defect will be repeated at each chip site. Thus, conventional comparative techniques for defect detection are not functional in a step-and-repeat wafer imaging system.

One technique of eliminating dirt particles from the reticle is to use a thin, transparent protective membrane which is placed over the mask at some distance from the mask surface. This membrane, known as a "pellicle" is employed to protect the mask and render any particle falling on its surface out of focus in the image plane. Pellicles as such are disclosed in U.S. Pat. No. 4,131,363. Pellicles, however, can protect only to a certain degree or a given offset. There will be defects which, if located on the pellicle, can affect the printed image on the wafer. Thus, while the use of pellicles is effective to a certain extent, it is still necessary to detect and/or eliminate defects of a certain size on the pellicle itself. This problem becomes more acute as device sizes decrease. Image control becomes tighter and the devices are increasingly vulnerable to the smaller pellicle defects. The trend is for reduced device sizes and the use of optical lithography techniques that employ pellicles. The optical comparator techniques discussed in the prior art, while generally used to detect defects on the mask, can also be used in some limited instances to determine defects on pellicles. One continuing problem is the need in prior art techniques to physically handle or contact delicate pellicles.

Levy, supra, discloses one form of defect detection and a KLA100 series device manufactured by KLA Instruments Corp. discloses another type of commercially available optical comparator system. The inventor of the invention described herein has explored various defect types associated with pellicle parameters used in step-and-repeat projection optical microlithography systems. Such are reported in SPIE, Vol. 470, "Optical Multilithography III Technology for the Next Decade", pp. 138–146 (March 1984). A number of defect types are explored vis-a-vis the sub-micron patterns which are produced in a repeating sequence over the entire substrate surface. As is apparent from the discussion therein and the prior art, since stepper reticles do not contain repeated patterns, conventional comparator techniques cannot be used for their inspection. Thus, a need exists to allow comparator technology to be applied for defect detection produced by defects appearing in or on the reticle or the pellicle.

SUMMARY OF THE INVENTION

Given the deficiencies in the prior art, this invention solves the problem of defect detection in step-and-repeat systems by enhancing the image of the defect in one chip size without appreciably changing all other chip site images. This is, the step-and-repeat projection printer is employed to print two or more images of the mask/pellicle in a way which enhances the image of a defect in one of the images without appreciably changing all of the other pattern images. To accomplish this result in one embodiment, one image is exposed at a normal intensity level. This results in printing of all mask patterns with the required fidelity. A second chip site is then exposed employing the same reticle at a lower intensity level. The underexposure is typically in a range of 10%. By using a proper exposure material, a slight underexposure will leave a residual photoresist at those positions of the defects on the mask/pellicle while leaving no resist in the non-defect pattern areas. Typical exposure materials are commercially available photoresists. This technique results in having the optical imagery of the two chip sites significantly different at defect locations. The images created can then be compared using available comparative techniques in the defect sites affirmatively located. In other embodiments, a change in time or in reticles is used to change exposure conditions with an underexposure employed to highlight defects. Additionally, the underexposure resist is a very thin film such that color differences vis-a-vis the background can be used to locate defect sites.

This invention will be discussed in greater detail by referring to the attached drawings and the description of the preferred embodiment as follows.

DESCRIPTION OF THE PREFERRED EMBODIMENT

Figure 1:
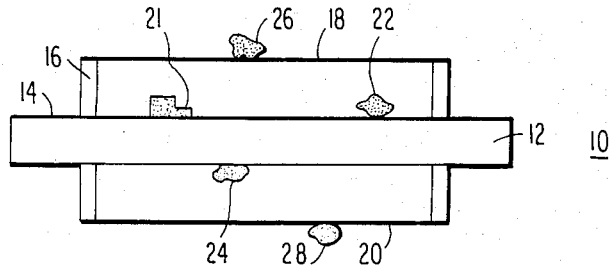
FIG. 1 is a schematic view illustrating the common types of defects occurring in a mask/pellicle system.

Referring now to FIG. 1, three common types of defects which are present on the mask/pellicle are schematically illustrated. FIG. 1 illustrates a mask 10 typically having a transparent support 12 such as quartz or borosilicate glass having a chromium or silver surface 14 formed on one side. It is to be understood that the chromium or silver layer 14 provides the pattern by having opaque and transparent areas, not shown. Suitable spacers 16 are placed over the support 12 and pellicles 18–20 are separated from the mask surface to protect the chrome or silver pattern.

FIG. 1 illustrates a first defect 21 which is in the chrome pattern. This is a randomly occurring defect in the pattern which will repeat on each chip site.

A second type of defect is contamination on either mask surface. A first contamination site is identified as element 22 and a second as element 24. Depending on the location of the contamination vis-a-vis the mask surface where it appears, one defect may be in sharp focus while the other (24) will be somewhat out of focus. Finally, a contamination of the pellicle is illustrated as defects 26 and 28 at pellicles 18 and 20, respectively. In accordance with this invention, all three types of defects can be detected. For a more complete analysis of defects per se, Flamholz, supra, provides such elaboration.

Figure 2:
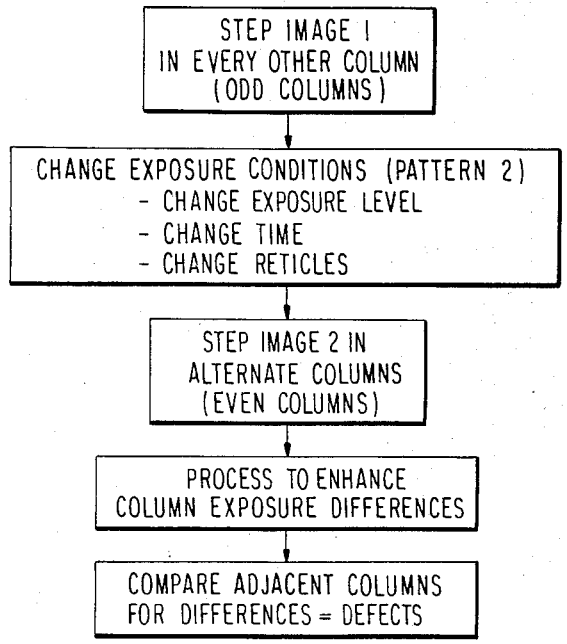
FIG. 2 is a block diagram setting forth the steps for defect location in a step-and-repeat alignment and exposure system in accordance with this invention.

Referring now to FIG. 2, the methodology of this invention with respect to detection of various types of defects will be discussed.

Figure 3:
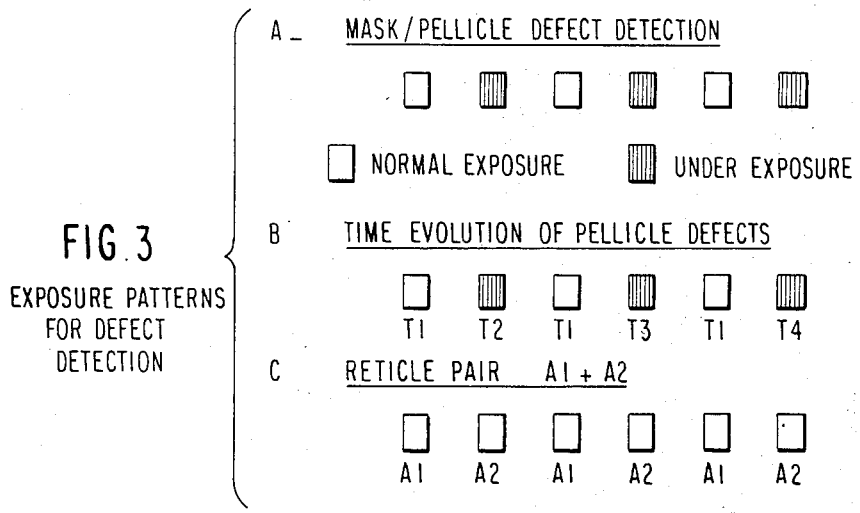
FIGS. 3A, B and C are a chart illustrating exposure patterns for defect detection.

A primary defect is that at the pellicle. In accordance with this invention as illustrated in FIG. 3, the appropriate exposure pattern is to use a step-and-repeat projection printer to alternately print two or more images of the mask/pellicle in a manner which enhances the image of the defect in one of the images without appreciably changing the other pattern image. Thus, as shown in FIG. 3A, every other image is printed with an underexposure. A typical exposure tool can be a GCA 6000 using a 5X lens. A typical resist is 1:1μ thick. The exposure levels range from the nominal to approximately 10% from the nominal level. The results demonstrate that the defect site is significantly different at various exposures while the non-defective sites are ostensibly the same. Even more graphic differences can be obtained in other defective sites where residual resist at the defect site appears both as a color and shape difference.

In this general methodology, the deviations of a mask/pellicle from a normal condition are determined by exposing two or more patterns under different conditions. One example is a difference of exposure level to enhance the image difference. However, other deviations in the mask/pellicle utilizing the same general approach can be employed.

One variation is the time evolution of defects. In this embodiment, monitoring of the defect levels of a mask or mask/pellicle combination as a function of time is accomplished while the system is in use. With this mode of utilization, a site which has no defect at Time 1 accumulates a defect at Time 2. Thus, the different conditions of exposure are timed. In practice, time evolution of defects in the mask or mask/pellicle can be moniored according to the following technique.

Referring to FIG. 2, initially every other column in a row or rows is exposed at Time 1 (T1) using the Step-and-Repeat Projection Printer (stepper). This first step is illustrated in FIG. 3B. Then, at subsequent times T2, T3, Tn, alignment and exposure of an image in one of the open columns is accomplished using an underexposed intensity level. This second step illustrated in FIG. 1 in the second box is therefore a change in exposure conditions as a function of time. This is the equivalent to the change of exposure conditions from the first example where a change in exposure level occurred.

By using this technique, a comparison of pairs of adjacent columns will indicate a change from T1 and indicate the time evolution of defect levels on the mask/pellicle which can be used to monitor contamination levels of the mask/pellicle plane without removing or handling the mask/pellicle. Processing then occurs as in the first case. That is, processing occurs to enhance column exposure differences followed by a comparison of adjacent columns to determine whether differences occurred. A positive indication of differences is evidence of defects.

A third technique is determination of randomly located defects in the mask plane. These defects may occur in the initial mask materials, as a result of mask pattern fabrication, or may be added to the mask after mounting of the pellicle. These defects produce images at the wafer plane which are equally as sharp and intense as non-defect pattern areas. Thus, they cannot be detected by normal comparator techniques or by the above two referenced methods.

In order to determine the presence of defects which are randomly located in the mask plane, two different versions of the same reticle design are exposed in alternating pairs and then compared via the comparator. Such is illustrated schematically in FIG. 3C. Mask A1 is used to expose odd columns while a second mask, A2, exposes even columns. Referring then to FIG. 2, change in exposure conditions, step 2, is a change in reticles.

Because the defects are randomly located, all randomly introduced particulate materials and pattern defects will not occur at the same location on both masks (A1 and A2) such that this technique will inspect both masks simultaneously. Since the reticle and masks for steppers are always fabricated in pairs, one generally used for backup, this technique offers a simple and viable procedure for inspection of reticles. With this technique, processing then occurs in a manner consistent with the other two techniques, that is, processing and comparison to determine the presence of defects.

This invention will also operate by sensing color change conditions. Specifically, when the defect site is underexposed a residual thin film of resist remains. The thickness is a fraction of a wavelength of visible light. Consequently, when illuminated, the thin film will exhibit a color difference with respect to the background. If different filters are used, such as a filter wheel, the background can be filtered out. The remaining physical color difference can be processed as a difference in intensity between the fully developed background and the defect site.

Thus, as set forth herein, this invention provides a technique of determining defects utilizing step-and-repeat projection concepts where a potential defect can be printed at every site. It is apparent that modifications of this invention can be practiced without departing from the essential scope of this invention.

I claim:

1. A method of detecting defects in a step-and-repeat projection system for imaging patterns from a reticle subject to contamination onto a substrate comprising the steps of:

exposing a first site on said substrate coated with a photosensitive film to radiation through said reticle to achieve a first exposure condition;

exposing a second site on said substrate coated with said photosensitive film to radiation to achieve a second exposure condition; and comparing by an optical comparator the first and second sites to identify the presence and location of defects by a difference in optical imagery existing at said first and second sites.

2. The method of claim 1 wherein said first exposure condition is a full exposure of said photosensitive film and said second exposure condition is an underexposure of said photosensitive film.

3. The method of claim 2 wherein said underexposure is approximately 10% less than a full exposure.

4. The method of claim 1 wherein prior to exposure said first and second sites are defined on said substrates at different locations and said substrate is coated with said photosensitive film.

5. The method of claim 4 wherein said photosensitive film is a photosensitive resist and said resist is developed to obtain a residual film at said first and second sites.

6. The method of claim 5 wherein said residual film at a defect site is a color and shape different than at a defect-free site.

7. The method of claim 1 wherein said first exposure condition is a full exposure of said first chip site at a first time and said second exposure condition is an underexposure of said second chip at a second time subsequent to said first time.

8. The method of claim 7 wherein said first and second chip sites are defined on said substrate and differet locations and wherein said substrate is coated with said photosensitive film.

9. The method of claim 7 wherein said underexposure is approximately 10% less than a full exposure.

10. The method of claim 7 wherein said first and second chip sites are in different columns of rows of chip sites.

11. The method of claim 7 wherein said residual film at a defect site is a color and shape different than at a defect-free site.

12. The method of claim 1 wherein said second exposure condition occurs by exposing said second site to radiation through said reticle.

13. The method of claim 7 wherein said second exposure condition occurs by exposing said second site to radiation through said reticle.

14. The method of claim 1 wherein said second exposure condition occurs by exposing said second site to radiation through a second reticle different from said reticle but having the same pattern.

* * * * *